(12) United States Patent
Kumagai et al.

(10) Patent No.: US 7,436,024 B2
(45) Date of Patent: Oct. 14, 2008

(54) SEMICONDUCTOR DEVICE AND METHOD OF MANUFACTURING THE SAME

(75) Inventors: Naoki Kumagai, Nagano (JP); Yuuichi Harada, Nagano (JP); Hiroshi Kanemaru, Nagano (JP); Yoshihiro Ikura, Nagano (JP); Ryuu Saitou, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 190 days.

(21) Appl. No.: 11/196,528

(22) Filed: Aug. 3, 2005

(65) Prior Publication Data

US 2006/0027863 A1 Feb. 9, 2006

(30) Foreign Application Priority Data

Aug. 4, 2004 (JP) .............................. 2004-228598

(51) Int. Cl.
    *H01L 29/94* (2006.01)
(52) U.S. Cl. ........................................ 257/335; 257/336
(58) Field of Classification Search ................. 257/335, 257/336
    See application file for complete search history.

(56) References Cited

U.S. PATENT DOCUMENTS 7,173,308 B2 * 2/2007 Kitaguchi ................... 257/342

FOREIGN PATENT DOCUMENTS

| JP | 11-102982 A | 4/1999 |
| JP | 11-121742 A | 4/1999 |
| JP | 2001-352070 A | 12/2001 |

* cited by examiner

*Primary Examiner*—Douglas M Menz
(74) *Attorney, Agent, or Firm*—Rossi, Kimms & McDowell LLP

(57) ABSTRACT

A lateral MOSFET and a method of forming thereof includes a p-type semiconductor substrate, a first n-type well in the surface portion of the semiconductor substrate, an $n^+$-type drain region in the first n-type well, a p-type well in the first n-type well, an $n^+$-type source region in the p-type well, a gate oxide film on the portion of the p-type well between the $n^+$-type source region and the first n-type well, a gate electrode on the gate oxide film, and a second n-type well containing the p-type well therein to increase the n-type impurity concentration in the vicinity of the junction between the p-type well and the first n-type well beneath the gate and to increase the impurity amount and the thickness of the n-type semiconductor region beneath the p-type well. The first and second n-type wells can be overlapping or formed continuous or contiguous with each other. The lateral MOSFET exhibits a high punch-through breakdown voltage suitable for a high-side switch.

11 Claims, 15 Drawing Sheets

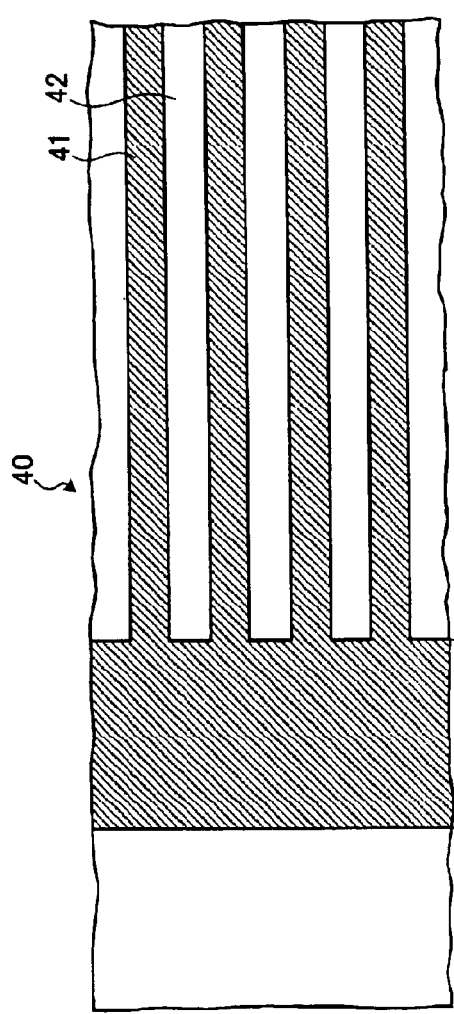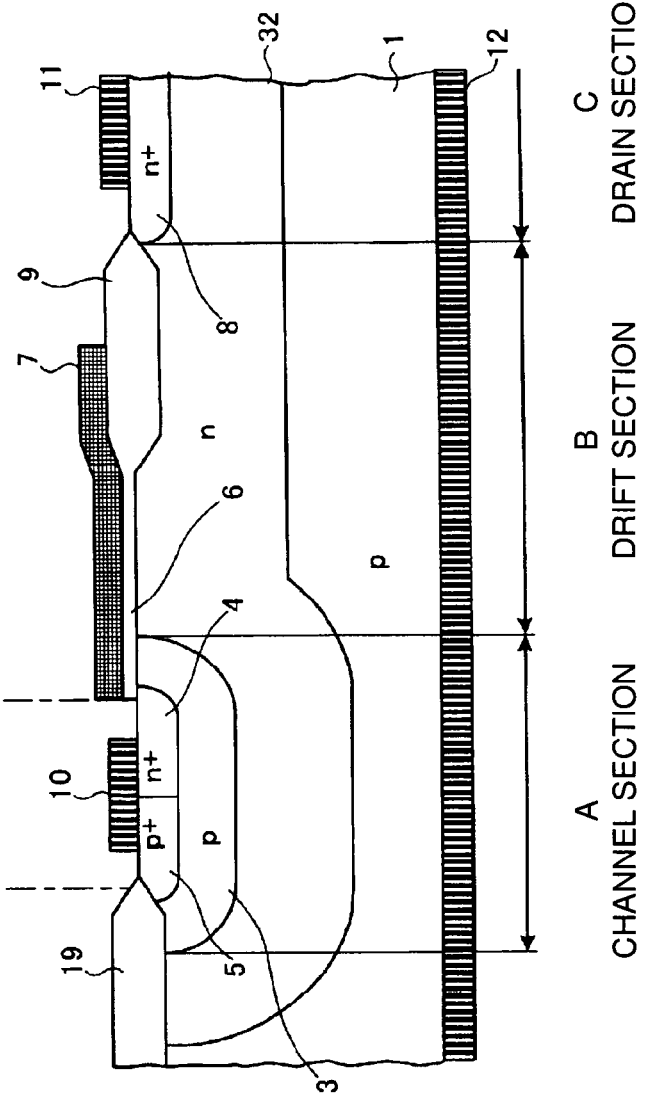
FIG. 7(b)
FIG. 7(a)

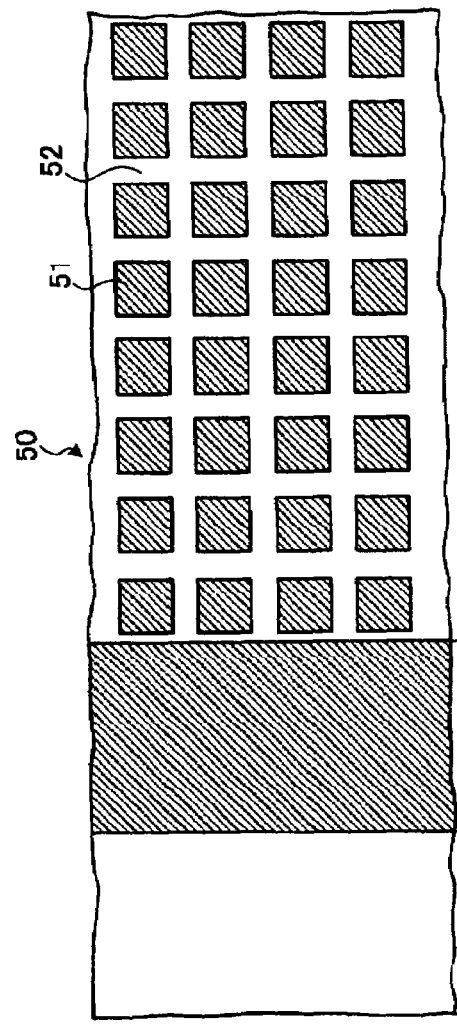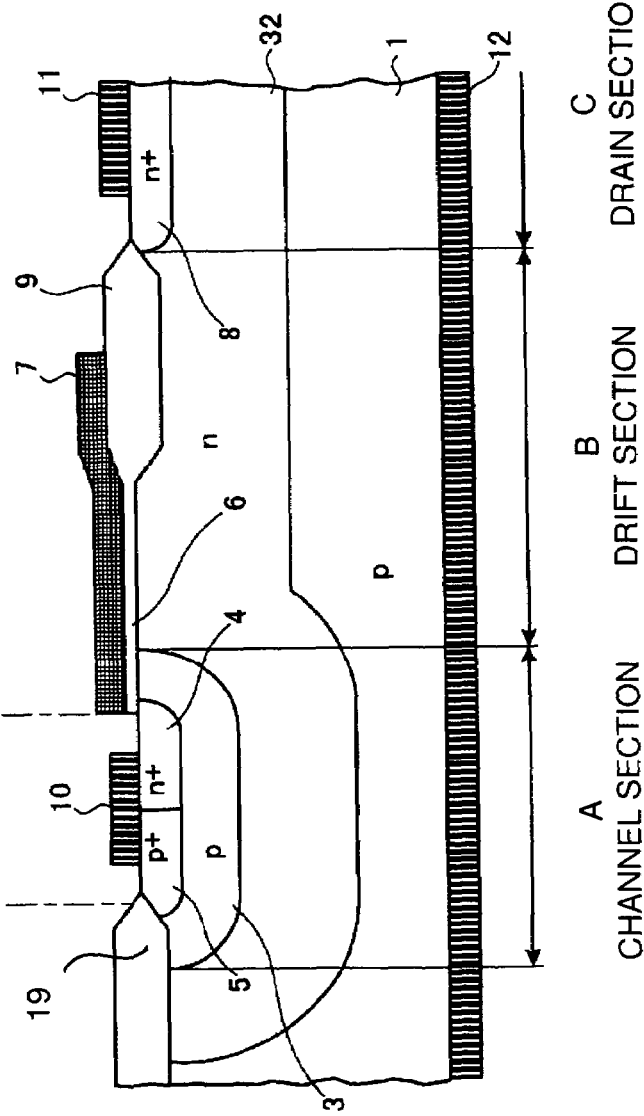
FIG. 8(b)
FIG. 8(a)

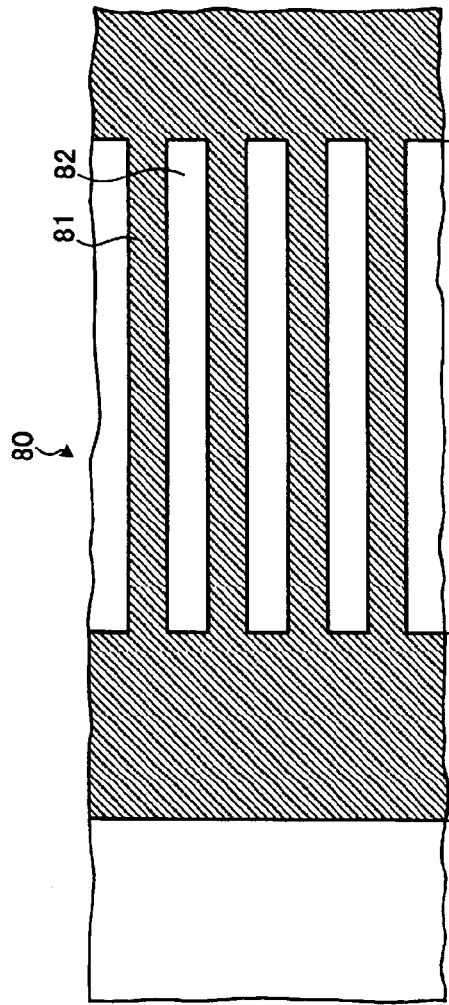
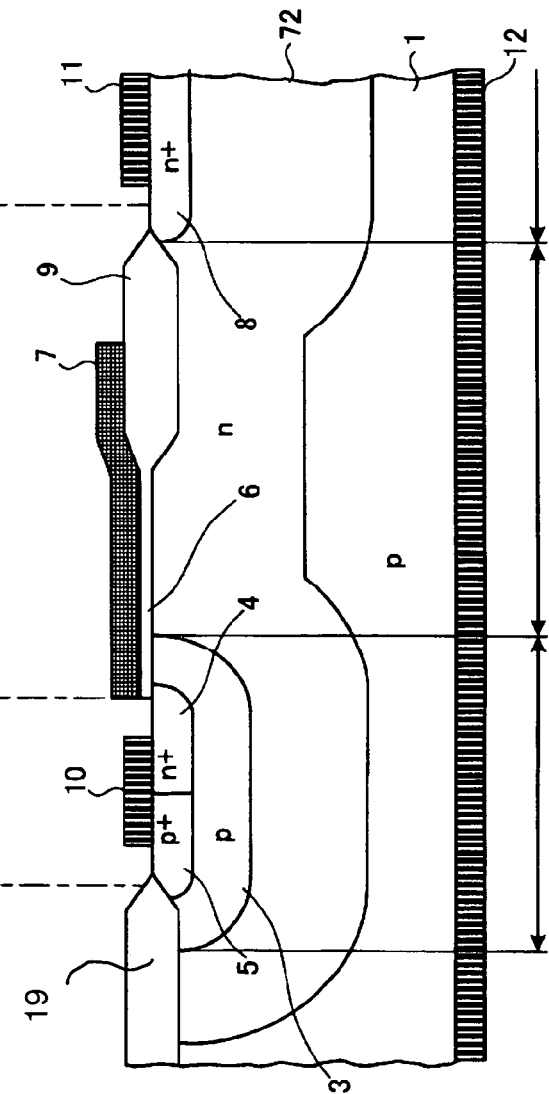
FIG. 10(b)
FIG. 10(a)

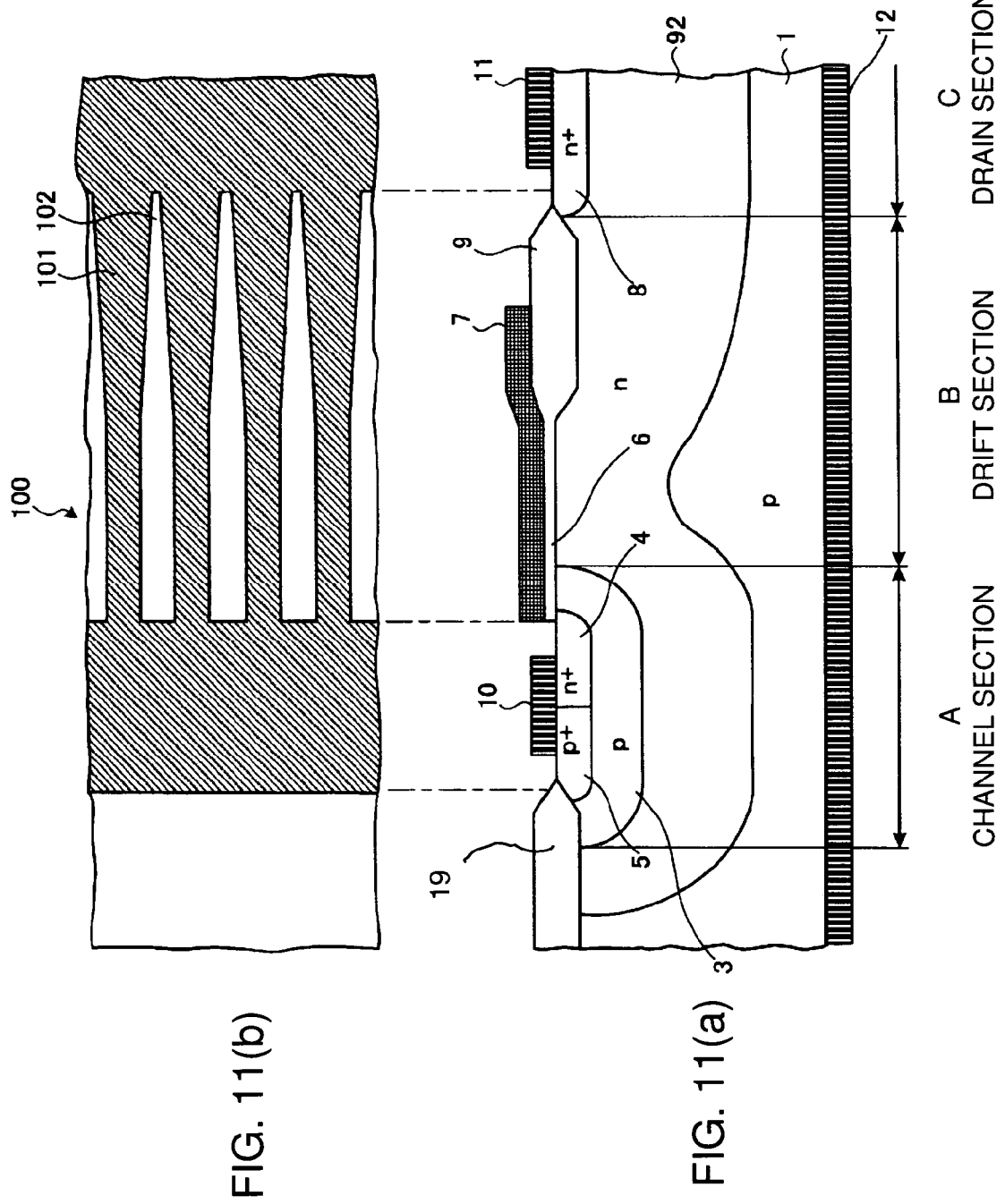

US 7,436,024 B2

SEMICONDUCTOR DEVICE AND METHOD OF MANUFACTURING THE SAME

BACKGROUND

Referring to FIG. 12, which is a cross sectional view of a conventional lateral MOSFET, an n-type well 2 is formed in the surface portion of a p-type semiconductor substrate 1. A p-type well 3 is formed selectively in the surface portion of n-type well 2. An $n^+$-type source region 4 and a $p^+$-type contact region 5 are formed in the surface portion of the p-type well 3. A source electrode 10 is in contact with both the $p^+$-type contact region 5 and the $n^+$-type source region 4. An $n^+$-type drain region 8 is formed in the surface portion of the n-type well 2 and spaced apart from the p-type well 3. A drain electrode 11 is in contact with the $n^+$-type drain region 8.

A portion (extended) of the p-type well 3 extends between the $n^+$-type source region 4 and the n-type well 2 so that the $n^+$-type source region 4 is spaced apart from the n-type well 2. A gate electrode 7 is above the extended portion of p-type well 3 with a gate oxide film 6 interposed therebetween. The gate oxide film 6 and the gate electrode 7 extend to the vicinity of the $n^+$-type drain region 8. A LOCOS oxide film 9 is formed on a portion (sandwiched) of the n-type well 2, sandwiched between the portion of the gate electrode 7 on the drain side and the $n^+$-type drain region 8 for relaxing the electric field in the sandwiched portion of the n-type well 2 beneath the gate electrode 7. A similar LOCOS oxide film 19 is formed adjacent to the $p^+$-type contact region 5 and the p-type well 3, extending in the opposite direction (straddling the n-type well 2 and outside the same). A back electrode 12 is formed on the back surface of the p-type semiconductor substrate 1. Usually, the back electrode 12 is biased at the same potential as the source electrode 10.

When a voltage lower than the threshold voltage is applied to the gate electrode 7, in the state where a voltage positive with respect to the potential of the source electrode 10 is applied to the drain electrode 11, no current flows in the MOSFET having the structure shown in FIG. 12 since the pn-junction between the p-type well 3 and the n-type well 2 is biased in reverse. In contrast, when a voltage higher than the threshold voltage is applied to the gate electrode 7, an inversion layer is formed in the surface portion of the p-type well 3 beneath the gate electrode 7. Since current flows from the $n^+$-type drain region 8 to the $n^+$-type source region 4 via the n-type well 2 and the inversion layer formed in the surface portion of the p-type well 3, the well known MOSFET switching operations can be carried out.

Since the p-type well 3 and the p-type semiconductor substrate 1 are spaced apart for the n-type well 2, the MOSFET having the structure described above is applicable to the high-side switching, in which the potentials of the $n^+$-type source region 4 and the p-type well 3 become high in the ON-state of the MOSFET. To improve the tradeoff relation between the breakdown voltage and the ON-voltage in the lateral MOSFET having the structure described above, it is effective to employ a reduced surface field structure (hereinafter referred to as a "RESURF structure"). In applying the RESURF structure, the total impurity amount per unit area in the n-type well 2 is set around $1 \times 10^{12}$ $cm^{-2}$, which is known as the RESURF condition.

A semiconductor device having the following structure is known to those skilled in the art. The known semiconductor device is a lateral MOSFET including an $n^-$-type epitaxial layer grown on a p-type semiconductor substrate, a p-type body region formed in the $n^-$-type epitaxial layer, a $p^+$-type channel region formed in the body region, an $n^+$-type source region formed in the body region, an $n^+$-type drain region formed in the epitaxial layer such that the drain region is spaced apart from the channel region, a gate electrode above the portion of the epitaxial layer between the source region and the drain region as well as above the p-type channel region with a gate oxide film interposed therebetween, and an $n^+$-type buried region beneath the body region. See for instance, JP P Hei. 11 (1999)-102982 A (FIG. 1).

Another semiconductor device having the following structure is known to those skilled in the art. This semiconductor device is a MOSFET exhibiting a high breakdown voltage. It includes a p-type semiconductor substrate, a p-type body layer formed selectively in the surface portion of the semiconductor substrate, an $n^+$-type source layer formed selectively in the surface portion of the body layer, an $n^-$-type first offset layer formed selectively in the other surface portion of the semiconductor substrate different from the surface portion, in which the body layer is formed, an $n^-$-type second offset layer formed selectively in the surface portion of the first offset layer, an $n^+$-type drain layer formed selectively in the surface portion of the second offset layer, a gate electrode above the portion of the body layer extending between the source layer and the first offset layer with a gate insulator film interposed therebetween, a source electrode in contact with the body layer surface and the source layer surface, and a drain electrode on the drain layer. See for example JP P Hei. 11 (1999)-121742 A (FIG. 1).

Still another semiconductor device having the following structure is known to those skilled in the art. This known semiconductor device is a lateral MOSFET including a substrate, including an n-type semiconductor layer, a p-type base region formed in the surface portion of the semiconductor layer, an $n^+$-type source region in the surface portion of the p-type base region, an $n^+$-type drain region arranged in the surface portion of the semiconductor layer such that the drain region is spaced apart from the base region, the portion of the base region between the source region and the drain region being a channel region, a gate insulator film on the channel region, a gate electrode on the gate insulator film, a source electrode connected to the source region, and a drain electrode connected to the drain region. This lateral MOSFET further includes an n-type region in the surface portion of the semiconductor layer between the drain region and the base region, the n-type region being doped more heavily than the semiconductor layer, and the portion of the n-type region closer to the drain region being doped more heavily. See for instance JP P 2001-352070 A (FIGS. 1 and 2).

In the conventional lateral MOSFET having the structure shown in FIG. 12, the impurity concentration in the portion of the n-type well 2 in the vicinity of the junction between the p-type well 3 and the n-type well 2 is very low due to the diffusion for forming the p-type well 3. In growing the LOCOS oxide film 9 after forming the n-type well 2, boron atoms used typically for a p-type impurity in the p-type semiconductor substrate 1 are extracted to grow the LOCOS oxide film. Due to the boron extraction, the net n-type impurity concentration of the n-type well under the LOCOS oxide film 9 rises and the impurity concentration gradient becomes especially steep, as illustrated in FIG. 13(b), from the vicinity of the junction between the p-type well 3 and the n-type well 2 to the source-side end of the LOCOS oxide film 9. The structure near the Si surface from the p-type well 3 to the source-side end of LOCOS oxide film 9 is schematically shown in FIG. 13(a). The impurity concentration profile across the structure shown in FIG. 13(a) is illustrated FIG. 13(b).

The electric field strength profile around the avalanche voltage under the RESURF conditions, under which the depletion layer expanding from the junction between the n-type well 2 and the p-type semiconductor substrate 1 (see FIG. 12) and the depletion layer expanding from the junction between the n-type well 2 and the p-type well 3 are brought into contact with each other at the impurity concentration profile as illustrated in FIG. 13(b), and the lateral expansions of the depletion layers are enhanced (RESURF effects), as shown in FIG. 13(c). As shown FIG. 13(c), the electric field strength is low in the vicinity of the junction between the n-type well 2 and the p-type well 3. The electric field strength exhibits the maximum in the vicinity of the source-side end of the LOCOS oxide film 9, at which the impurity concentration becomes high sharply. When the impurity concentration in the n-type well 2 is low, the electric field strength exhibits the maximum in the vicinity of the drain-side end of the LOCOS oxide film 9.

Since the electric field strength exhibits the maximum value in the vicinity of the source-side end of the LOCOS oxide film 9, the component, sustained between the p-type well 3 and the source-side end of the LOCOS oxide film 9, of the voltage expressed by the integration of the electric field strength is low. When the impurity concentration in the portion of the n-type well 2 between the p-type well 3 and the source-side end portion of the LOCOS oxide film 9 is low, the electrons flowing from the channel region, formed in the surface portion of the p-type well 3 beneath the gate electrode 7 by applying a voltage higher than the threshold voltage to the gate, into the n-type well 2 are liable to subject to the JFET effects. Therefore, the ON-resistance rises and the tradeoff relation between the breakdown voltage and the ON-resistance becomes worse. Since it is necessary to lower the impurity concentration in the n-type well 2 when the RESURF effects are not utilized, the ON-resistance rise by the JFET effects becomes more remarkable. Since the electric field strength beneath the gate-side end portion of the LOCOS oxide film 9 becomes very high when the n-type well 2 is doped heavily, the breakdown voltage is impaired. Therefore, it is not desirable to heavily dope the n-type well 2.

When the lateral MOSFET having the structure shown in FIG. 12 is used for a high-side switch, the following problems can occur. FIG. 14 is an equivalent circuit diagram showing a general connection example of a high-side switch using a MOSFET. As shown in FIG. 14, the drain terminal (D) of a MOSFET 21 is connected to a power supply and the source terminal (S) thereof to a load 22. The source potential in the ON-state of the MOSFET 21 is almost Vdd (≈Vdd−ON-voltage of the MOSFET).

FIG. 15 is a cross sectional view describing the depletion layer expansion in the ON-state of the lateral MOSFET used for a high-side switch. In the ON-state of the MOSFET 21, a depletion layer is expanded from the pn-junction between the n-type well 2 and the p-type semiconductor substrate 1 by the voltage applied between drain the electrode 11 and the back electrode 12 (Vdd (the drain voltage)−GND (the ground potential)). As the applied voltage becomes higher, the depletion layer expanding from the pn-junction between the n-type well 2 and the p-type semiconductor substrate 1 is connected to the depletion layer expanding from the pn-junction between the p-type well 3 and the n-type well 2. Further, a punch-through phenomenon can occur, by which current $I_{PT}$ is made to flow from the p-type well 3 to the p-type semiconductor substrate 1. Since the current $I_{PT}$ flows bypassing the load 22, the current $I_{PT}$ causes an invalid current. Therefore, it does not attain the primary purpose of making a current flow through the load 22.

Although the punch-through voltage depends on the impurity concentration gradient in the n-type well 2, the punch-through voltage is higher fundamentally as the total impurity amount in the portion of the n-type well 2 beneath the p-type well 3 is higher and as the substantial thickness of the n-type well 2 is larger. Here, the substantial thickness of the n-type well 2 is the thickness of the remaining portion of the n-type well 2 remaining after subtracting the portion, the conductivity type thereof is inverted by the p-type well 3, from the n-type well 2. When the n-type well 2 is under the RESURF condition, the net total impurity amount per unit area in the n-type well 2 is around $1 \times 10^{12}$ cm$^{-2}$. However, the total impurity amount in the portion of the n-type well 2 beneath the p-type well 3 is reduced greatly, since the n-type impurity in this portion of the n-type well 2 is canceled by the p-type impurity in the p-type well 3. The remaining thickness of the n-type well 2 beneath the p-type well 3 is also reduced.

Since the heavily doped portion near the surface of the n-type well 2 is canceled by the p-type well 3 especially when the n-type well 2 is formed by diffusion, the total impurity concentration and the thickness of the n-type well 2 are reduced remarkably. Although these troubles can be obviated by elongating the diffusion depth of the n-type well 2, it is necessary to conduct diffusion treatment at a high temperature for a long time. Since there exists a certain time limit for obtaining the diffusion depth of the n-type well 2 described above, it is difficult to attain the desired improvements. Since the p-type well 3 and the p-type semiconductor substrate 1 are biased at the same potential when the MOSFET described above is used for a low-side switch, however, the above-described troubles can be avoided.

There still remains a need to obviate the problems described above, and improve the tradeoff relation between the breakdown voltage and the ON-voltage. There also remains a need to provide a semiconductor device that exhibits a high punch-through voltage suitable for a high-side switch. The present invention addresses these needs.

SUMMARY OF THE INVENTION

The present invention relates to semiconductor devices and a method of manufacturing such semiconductor devices. Specifically, the present invention relates to lateral field effect transistors having a metal-oxide semiconductor structure (hereinafter referred to as "lateral MOSFETs") that can exhibit an improved tradeoff relation between the breakdown voltage and the ON-voltage.

One aspect of the present invention is a semiconductor device having a semiconductor layer of a first conductivity type, a first semiconductor region of a second conductivity type in the surface portion of the semiconductor layer, a drain region of the second conductivity type in the first semiconductor region, a second semiconductor region of the second conductivity type, a channel region of the first conductivity type in the surface portion of the second semiconductor region, a source region of the second conductivity type in the channel region, and a gate electrode above the portion of the channel region between the source region and the first semiconductor region with a gate insulator film interposed therebetween.

The second semiconductor region can be in contact with or overlap with the first semiconductor region. The first semiconductor region can be contiguous or continuous with the second semiconductor region. The channel region is spaced apart from the drain region. The second semiconductor region can be doped more heavily than the first semiconductor region. The net total impurity amount in the first semiconductor region can be smaller than the net total impurity amount in the second semiconductor region. The net total impurity amount in the first semiconductor region can be larger on the side of the drain region than on the side of the second semiconductor region. The net total impurity amount per unit area in the first semiconductor region can be between $0.5 \times 10^{12}$ cm$^{-2}$ and $3.0 \times 10^{12}$ cm$^{-2}$.

The semiconductor device can include a thick insulator layer for relaxing an electric field on a portion of the first semiconductor region between the drain region and the channel region. The portion of the first semiconductor region is spaced apart from the channel region.

Another aspect of the invention is a method of manufacturing the semiconductor device described above. The method can include forming a thick insulator film or films selectively on the surface of the semiconductor layer, implanting impurity ions of the second conductivity type in an self-aligning manner into portions of the semiconductor layer, to form the first and second semiconductor regions, using the thick insulator films as ion implantation masks, covering the portion of the semiconductor layer where the first semiconductor region is to be formed, with a mask film, and implanting impurity ions of the second conductivity type in an self-aligning manner into the portion of the semiconductor layer where the second semiconductor region is to be formed, using the thick insulator films and the mask film as ion implantation masks.

Alternatively, after forming the thick insulator film, the method can include covering portions of the semiconductor layer where the first semiconductor region and the second semiconductor region are to be formed, with a mask film having openings, and implanting impurity ions of the second conductivity type in an self-aligning manner into the portions of the semiconductor layer where the first semiconductor region and the second semiconductor region are to be formed, using the thick insulator film and the mask film as ion implantation masks.

The opening shape in the portion of the mask film for forming the first semiconductor region can be different from the opening shape in the portion of the mask film for forming the second semiconductor region. The portion of the mask film for forming the first semiconductor region can have a plurality of openings.

BRIEF DESCRIPTION OF THE DRAWINGS

FIG. 2(a) illustrates the structure near the Si surface of the lateral MOSFET, FIG. 2(b) illustrates the impurity concentration profile across the structure near the Si surface of FIG. 1(a), and FIG. 2(c) illustrates the electric field strength profile across the structure near the Si surface of FIG. 1(a).

FIGS. 7(a)-(b) illustrate a cross-sectional view of a third embodiment of a lateral MOSFET embodying the present invention, where FIG. 7(a) illustrates a cross-sectional view of the lateral MOSFET, and FIG. 7(b) illustrates a top plan view of the lateral MOSFET to illustrate the planar pattern of an ion implantation mask for forming an n-type well.

FIGS. 8(a)-(b) illustrate a cross-sectional view of a fourth embodiment of a lateral MOSFET embodying the present invention, where FIG. 8(a) illustrates a cross-sectional view of the lateral MOSFET, and FIG. 8(b) illustrates a top plan view of the lateral MOSFET to illustrate another planar pattern of an ion implantation mask for forming the n-type well.

FIG. 9(a) illustrates a cross-sectional view of the lateral MOSFET, and FIG. 9(b) illustrates a top plan view of the lateral MOSFET to illustrate yet another planar pattern of an ion implantation mask for forming the n-type well.

FIGS. 10(a)-(b) illustrate a cross-sectional view of a sixth embodiment of a lateral MOSFET embodying the present invention, where FIG. 10(a) illustrates a cross-sectional view of the lateral MOSFET, and FIG. 10(b) illustrates a top plan view of the lateral MOSFET to illustrate yet another planar pattern of an ion implantation mask for forming the n-type well.

FIGS. 11(a)-(b) illustrate a cross-sectional view of a seventh embodiment of a lateral MOSFET embodying the present invention, where FIG. 11(a) illustrates a cross-sectional view of the lateral MOSFET, and FIG. 11(b) illustrates a top plan view of the lateral MOSFET to illustrate the planar pattern of an ion implantation mask for forming the n-type well.

FIG. 13(a) illustrates the structure near the Si surface of the lateral MOSFET, FIG. 13(b) illustrates the impurity concentration profile across the structure near the Si surface of FIG. 13(a), and FIG. 13(c) illustrates the electric field strength profile across the structure near the Si surface of FIG. 13(a).

DETAILED DESCRIPTION

The n-type layer or the n-type region refers to a layer or a region where the electrons are the majority carriers. The p-type layer or the p-type region refers to a layer or a region where the holes are the majority carriers. The superscript "+" on the following the conductivity type "n" or "p" indicates that the layer or the region is doped relatively heavily. The superscript "−" following the conductivity type "n" or "p" indicates that the layer or the region is doped relatively lightly. Although the first conductivity type refers to the p-type and the second conductivity type refers to the n-type in the illustrated embodiments, the "n" and "p" types are interchangeable. That is, the first conductivity type can be the n-type and the second conductivity type can be the p-type.

Figure 1:
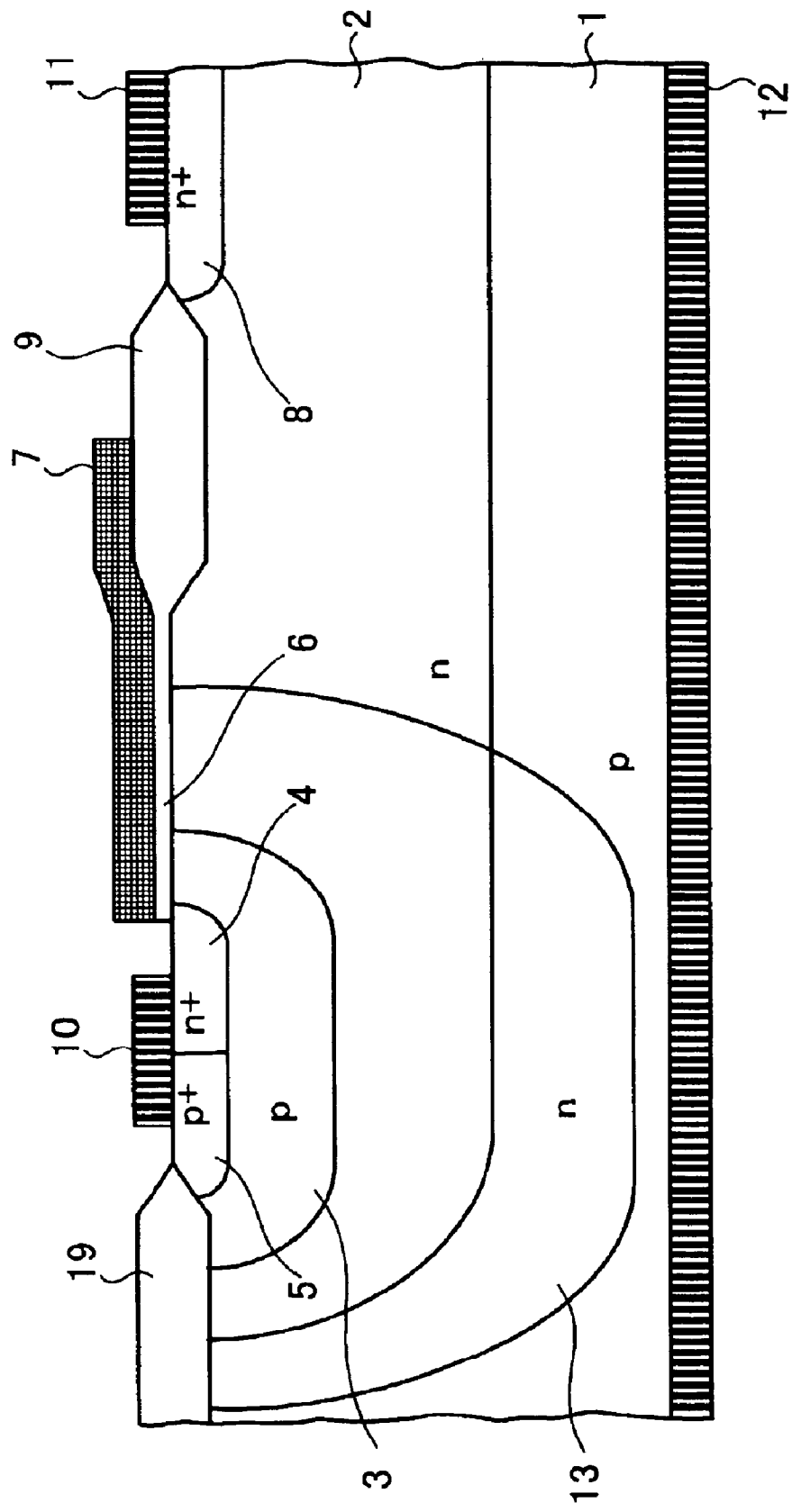
FIG. 1 is a cross sectional view of a first embodiment of a lateral MOSFET embodying the present invention.
Figure 12:
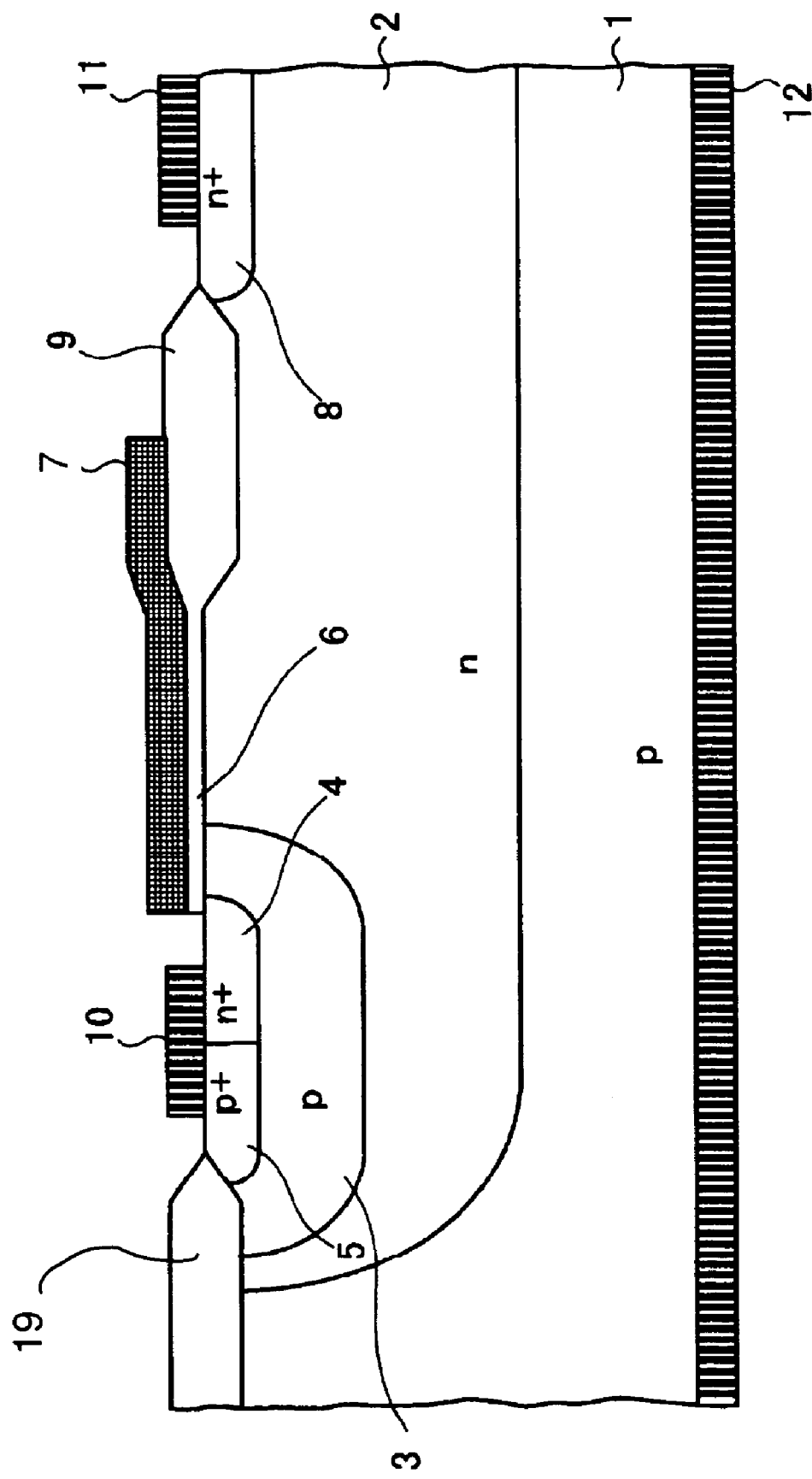
FIG. 12 is a cross sectional view of a conventional lateral MOSFET.

Referring to FIG. 1, the lateral MOSFET according to the first embodiment is similar to the conventional MOSFET structure of FIG. 12, but differs in that the first embodiment includes an additional n-type well 13. The conventional n-type well 2 will be referred to as the "first n-type well 2" and the additional n-type well 13 as the "second n-type well 13." The second n-type well 13 overlaps the first n-type well 2, surrounds the p-type well 3, and also extends below and outside the first n-type well 2.

Since the other configurations and the switching operations are the same as those of the conventional MOSFET structure shown in FIG. 12, their duplicated descriptions are omitted. In the MOSFET according to the first embodiment, the p-type semiconductor substrate 1, the first n-type well 2, the p-type well 3, the gate oxide film 6, the second n-type well 13, and the LOCOS oxide film 9 respectively correspond to a semiconductor layer, a first semiconductor region, a channel region, a gate insulator film, a second semiconductor region, and a thick insulator layer for electric field relaxation.

Figure 2:
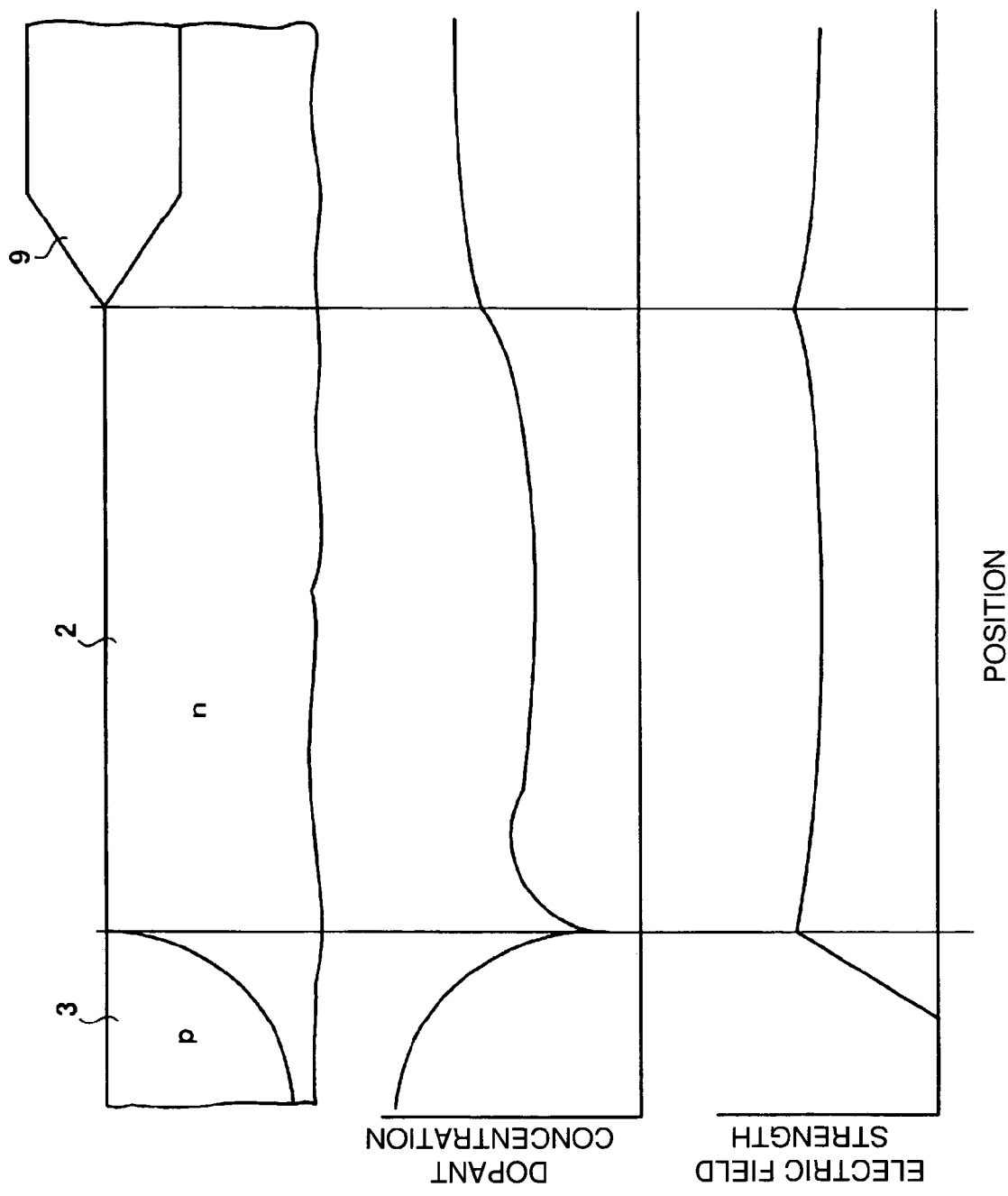
FIGS. 2(a)-(c) schematically illustrate the impurity concentration and electric field strength of the lateral MOSFET of FIG. 1, where

In the first embodiment, the n-type impurity in the second n-type well 13 forms a concentration gradient due to the lateral drive thereof. Therefore, the impurity concentration in the portion of the first n-type well 2 in the vicinity of the LOCOS oxide film 9 does not rise, although the impurity concentration in the portion of the first n-type well 2 in the vicinity of the p-type well 3 rises. Thus, the impurity concentration in the portion of the first n-type well 2 beneath the gate electrode 7 shows a relatively uniform distribution. The structure near the Si surface from the p-type well 3 to the LOCOS oxide film 9 is schematically shown in FIG. 2(a). The impurity concentration profile across the structure shown in FIG. 2(a) is illustrated in FIG. 2(b). The impurity concentration distributes relatively uniformly in the vicinity of the Si surface from the p-type well 3 to the source-side end portion of the LOCOS oxide film 9, excluding the closest proximity to the junction between the p-type well 3 and the first n-type well 2.

Figures 13A, 13B, 13C:
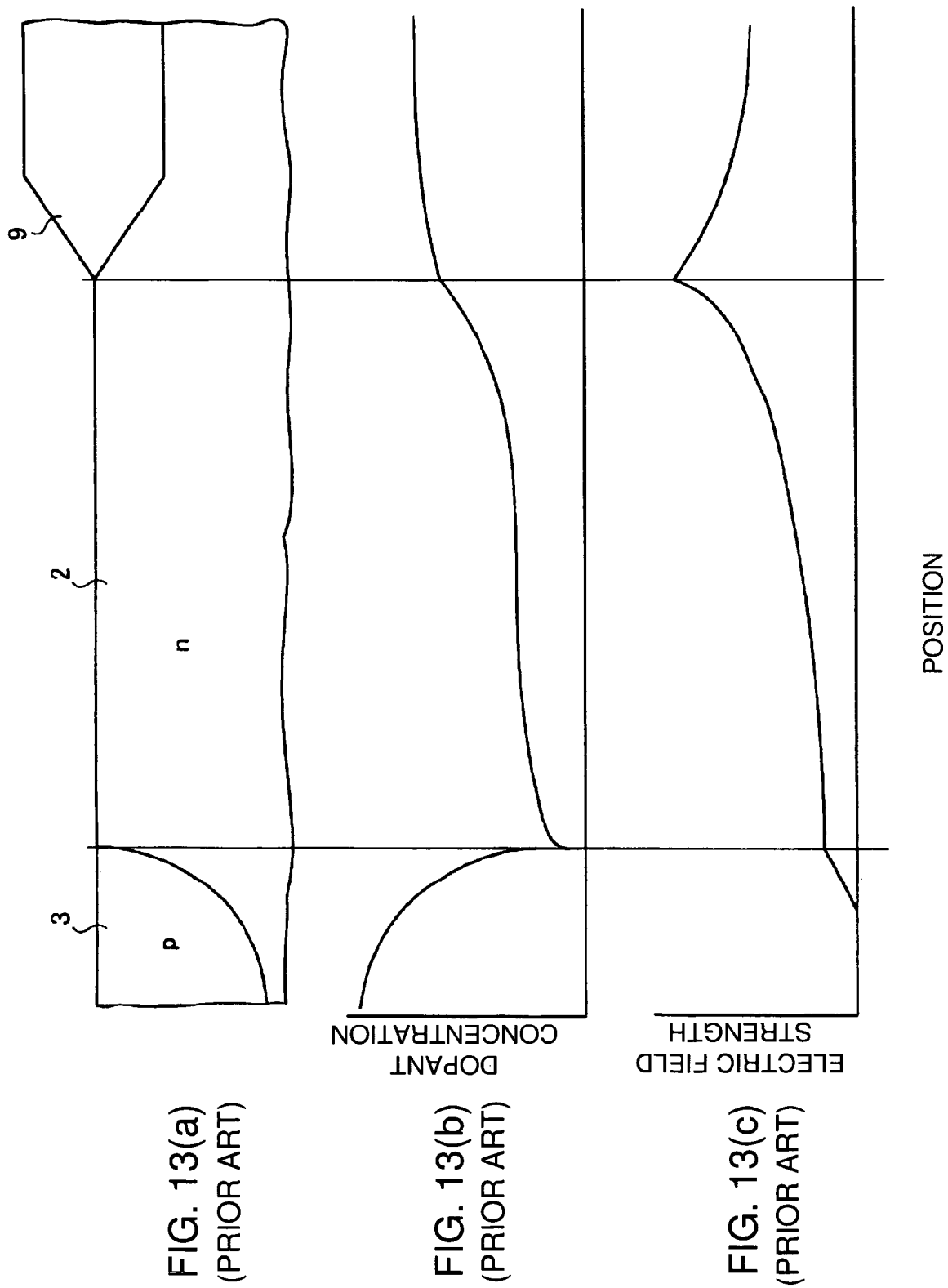
FIGS. 13(a)-(c) schematically illustrate the impurity concentration and electric field strength of the lateral MOSFET of FIG. 12, where
Figure 14:
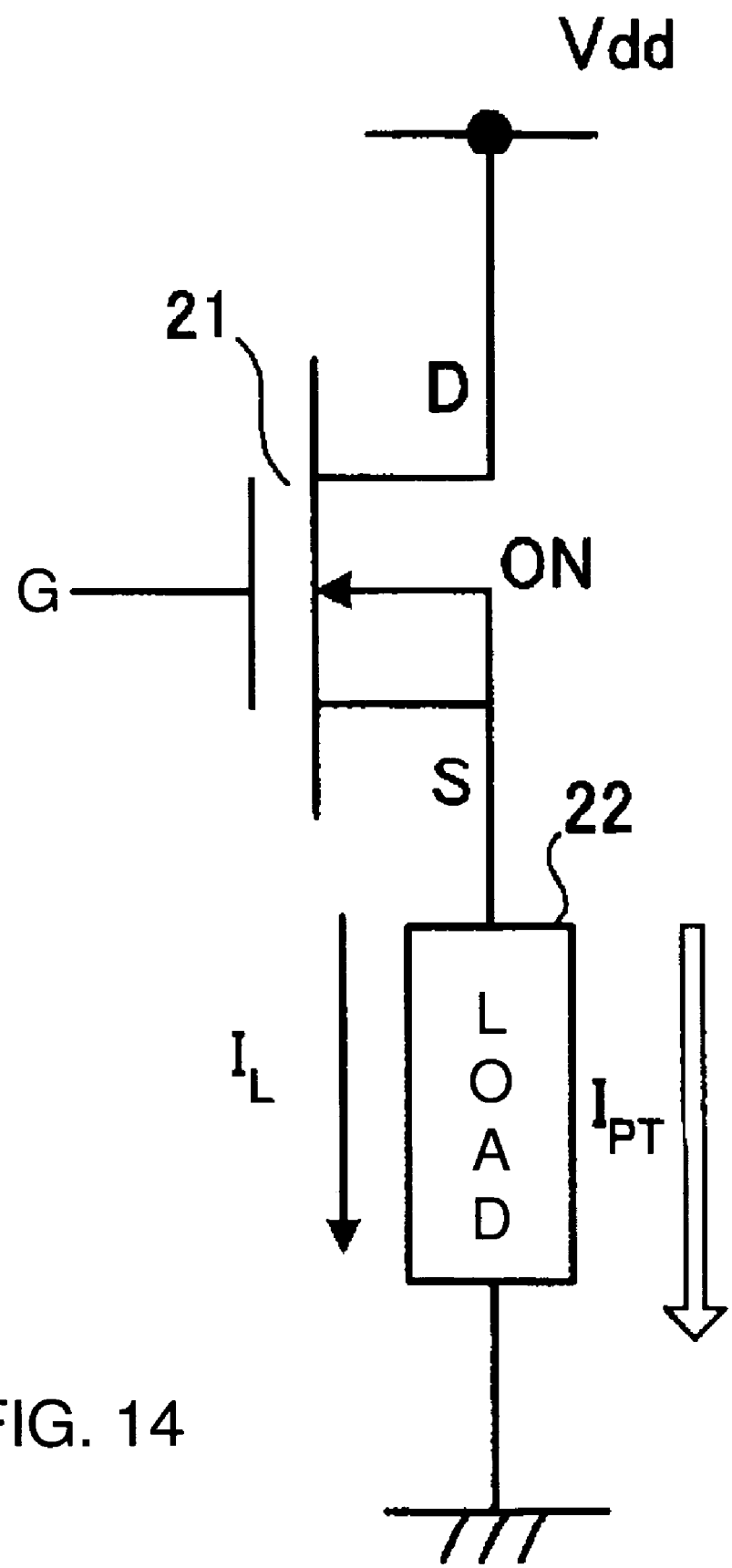
FIG. 14 is an equivalent circuit diagram showing a general connection example of a MOSFET high-side switch.
Figure 15:
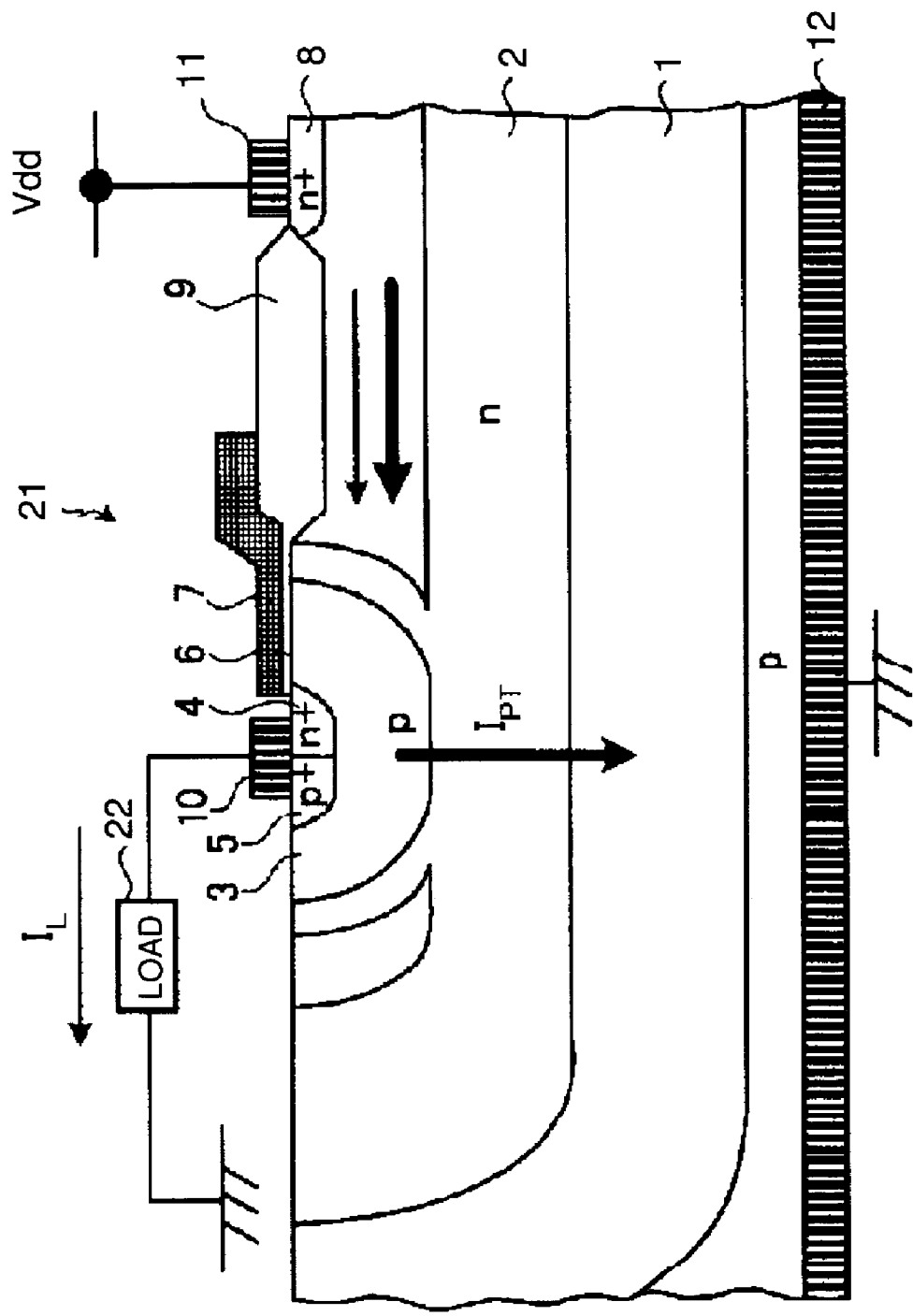
FIG. 15 is a cross sectional view describing the depletion layer expansion in the ON-state of the lateral MOSFET used for a high-side switch.

Referring to FIG. 1, the electric field strength profile around the avalanche voltage under the RESURF conditions, under which the depletion layer expanding from the junction between the first n-type well 2 and the p-type semiconductor substrate 1 is brought into contact with the depletion layer expanding from the junction between the first n-type well 2 and the p-type well 3 at the impurity concentration distribution profile as illustrated in FIG. 2(b) and the lateral expansions of the depletion layers are enhanced (RESURF effects), is schematically illustrated in FIG. 2(c). As shown in FIG. 2(c), the electric field strength exhibits peaks in the vicinity of the junction between the first n-type well 2 and the p-type well 3 and in the vicinity of the source-side end portion of the LOCOS oxide film 9. Therefore, the component, sustained between the first n-type well 2 and the source-side end portion of the LOCOS oxide film 9, of the voltage expressed by the integration of the electric field strength is higher than the voltage component according to the prior art shown in FIG. 13(c).

Since the impurity concentration near the surface of the first n-type well 2 beneath the gate electrode 7 is high and since the JFET effects are suppressed, the ON-resistance can be reduced. Moreover, since the second n-type well 13 joins the first n-type well 2, the n-type impurity amount beneath the p-type well 3 is higher than in the conventional MOSFET shown in FIG. 12. Since the junction between the second n-type well 13 and the p-type semiconductor substrate 1 can extend more deeply, the punch-through breakdown voltage of the MOSFET according to the first embodiment, which can be used for a high-side switch, can be raised. Since the second n-type well 13 and the first n-type well 2 can be thermally treated simultaneously, the manufacturing step increase becomes minimal.

Figure 3:
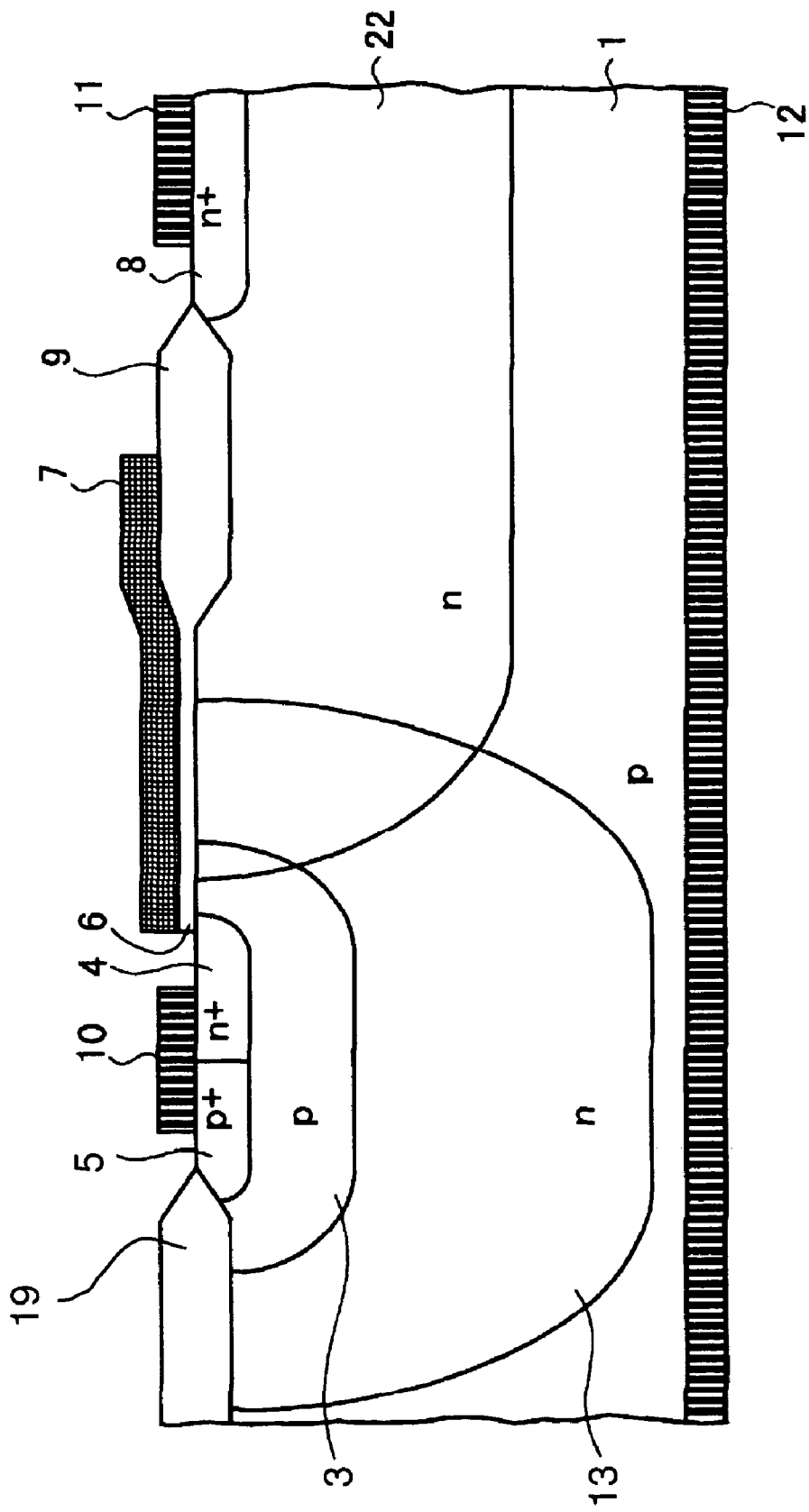
FIG. 3 is a cross sectional view of a second embodiment of a lateral MOSFET embodying the present invention.

Referring to FIG. 3, the MOSFET according to the second embodiment is similar to the first embodiment, but differs in that the first n-type well 22 corresponding to the first semiconductor region is not formed below the source electrode 10 in the second embodiment. The second n-type well 13 is doped more heavily than the first n-type well 22. This impurity concentration scheme prevents the impurity concentration in the portion beneath the gate oxide film 6 and between the p-type well 3 and the LOCOS oxide film 9 from becoming so high as to lower the breakdown voltage, when the second n-type well 13 is doped more heavily to further raise the punch-through breakdown voltage. Since the other configurations and the switching operations are the same as those of the first embodiment, their duplicated descriptions are omitted.

Figure 4:
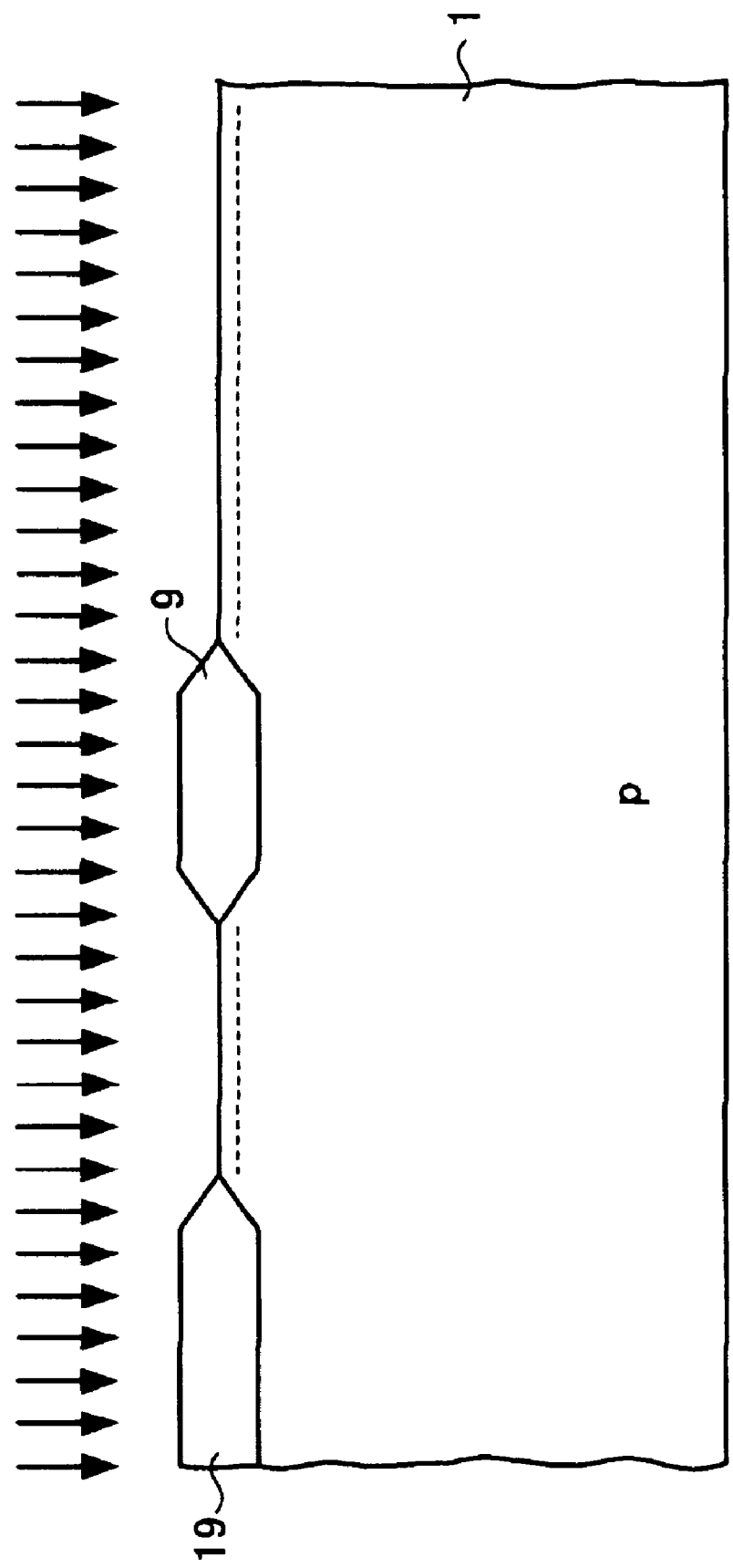
FIG. 4 is a cross sectional view illustrating a state midway in the process of manufacturing the semiconductor device having the structure shown in FIG. 3.

The MOSFET having the structure shown in FIG. 3 can be manufactured in the following way. First, the LOCOS oxide films 9 and 19 can be formed selectively in the surface portion of the p-type semiconductor substrate 1 as illustrated in FIG. 4. The p-type semiconductor substrate 1 is exposed in the surface area of the region, in which the first n-type well 22 will be formed, and in the surface area of the region in which the second n-type well 13 will be formed. Then, the n-type impurity ions can be implanted, in a self-aligning manner, into the regions of the p-type semiconductor substrate 1 in which the first n-type well 22 and the second n-type well 13 are to be formed respectively, using the LOCOS oxide films 9 and 19 as masks. Fine dotted lines near the surface of the p-type semiconductor substrate 1 represent the implanted n-type impurity atoms.

Figure 5:
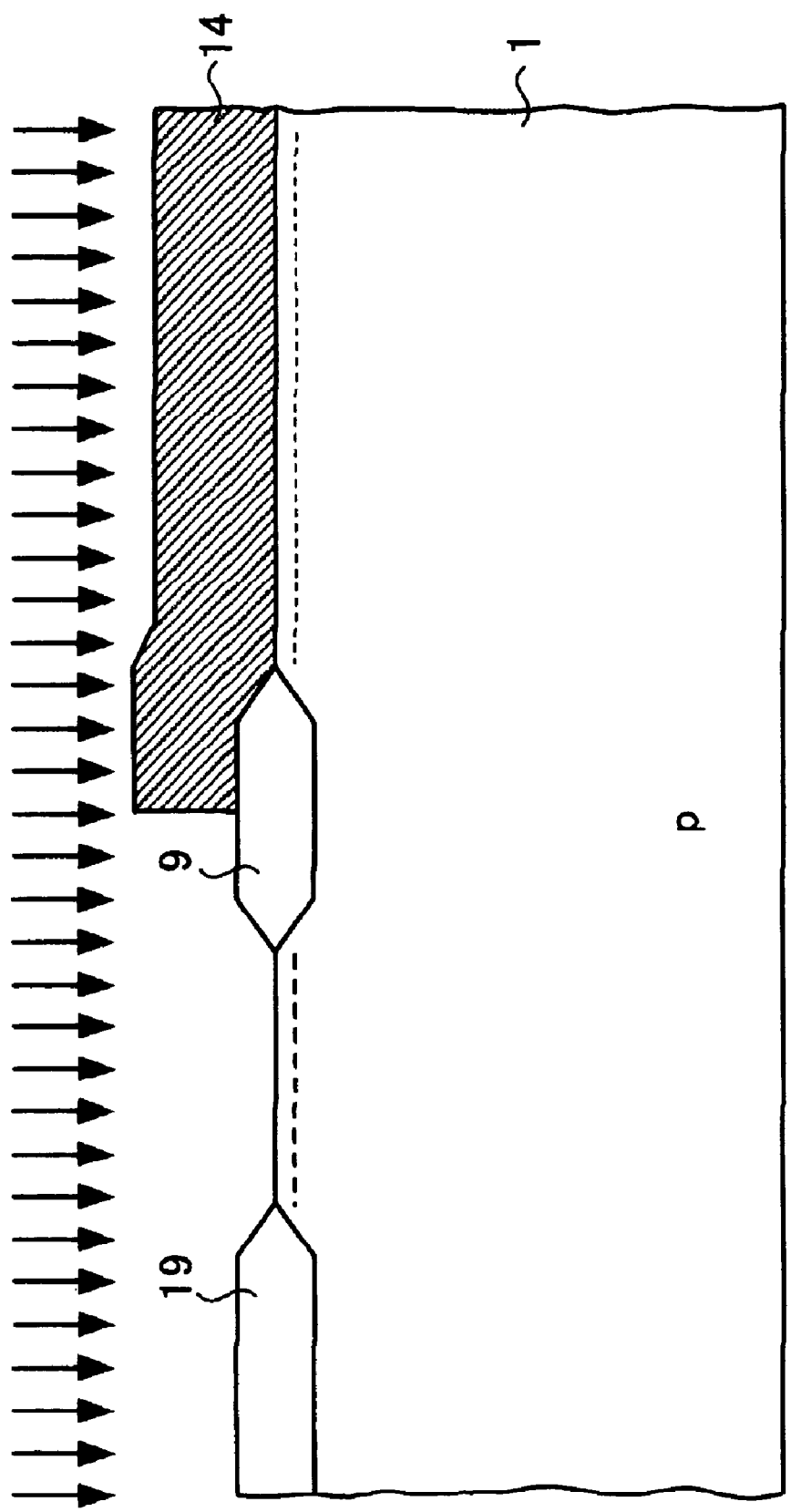
FIG. 5 is a cross sectional view describing another state midway in the process of manufacturing the semiconductor device having the structure shown in FIG. 3.

Then, the surface of the region in which the first n-type well 22 is formed in p-type semiconductor substrate 1 can be covered with a photoresist 14 or the like as a mask as shown in FIG. 5. Then, the n-type impurity ions can be implanted, in a self-aligning manner, further into the region of the p-type semiconductor substrate 1 in which the second n-type well 13 is to be formed, using the LOCOS oxide films 9, 19, and the film 14 as masks. In this ion implantation step, no n-type impurity is implanted into the region in which the first n-type well 22 is formed. In FIG. 5, the dotted lines near the surface of the p-type semiconductor substrate 1 represent the implanted n-type impurity atoms. The heavier or wider dotted line indicates that the impurity concentration indicated thereby is higher than the impurity concentration indicated by the finer dotted line.

Figure 6:
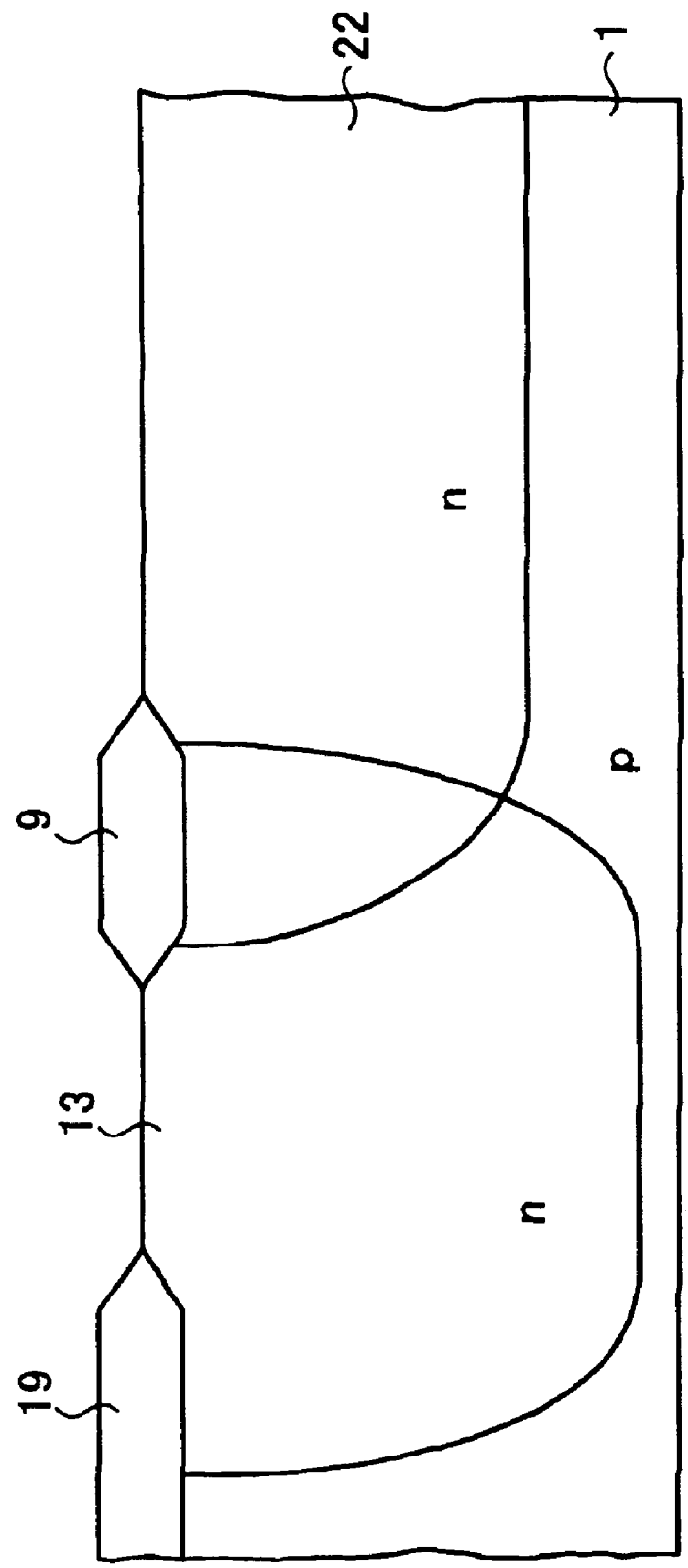
FIG. 6 is a cross sectional view describing still another state midway in the process of manufacturing the semiconductor device having the structure shown in FIG. 3.

Then, the film 14 for the ion implantation mask is removed as shown in FIG. 6. A heat treatment is conducted to drive the implanted n-type impurity atoms such that the first n-type well 22 and the second n-type well 13 can be formed. Since the ion implantation regions for forming the first n-type well 22 and the second n-type well 13 are determined by the same kind of oxide masks formed at the same time (LOCOS oxide films 9 and 19) according to the second embodiment, the first n-type well 22 and the second n-type well 13 can be formed with an excellent positional precision without paying much attentions to precise mask positioning. Then, the LOCOS oxide film 9 is removed once and then the LOCOS oxide film 9 is formed again at the position shown in FIG. 3. In other embodiments, only the LOCOS oxide film 19 can be used for forming the n-type wells 2 and 22, and the LOCOS oxide film 9 can be formed in the late step. In contrast, the LOCOS oxide film 9 is formed twice with the positions thereof displaced from each other in the second embodiment.

Referring to FIGS. 7(a) and (b), the lateral MOSFET according to the third embodiment is different from the first embodiment in that the first and second n-type wells 2 and 13 are formed as a single n-type well 32 in the corresponding region. The third embodiment is divided into three sections: a channel section A, a drift section B, and a drain section C. The channel section A is a section between the drain-side end of the p-type well 3 and the opposite end thereof. The drift section B is a section between the drain-side end of the p-type well 3 and the source-side end of the $n^+$-type drain region 8. The drain section C is a section including the $n^+$-type drain region 8 from the source-side end thereof. In the MOSFET divided as described above, the substantial impurity amount in the n-type well 32 is lower in the vicinity of the drift and drain sections B and C than in the vicinity of the channel section A. The n-type well 32 is deeper in the channel section A than in the drift and drain sections B and C. Since the other configurations and the switching operations are the same as those of the MOSFET according to the first embodiment, their duplicated descriptions are omitted.

Now the ion implantation mask for forming the n-type well 32 exhibiting the impurity distribution profile described above follows. As shown in FIG. 7(b), an ion implantation mask 40 has an opening fully exposing the channel section A and openings exposing the drift and drain sections B and C with the opening ratio of 1/2 for example. In the portion of the ion implantation mask 40 corresponding to the drift and drain sections B and C, non-opening stripes 42 and opening stripes 41 are arranged alternately, parallel to each other. The non-opening stripe 42 and the opening stripe 41 can be, for example, 1 μm in width. The openings in the ion implantation mask 40 are made to be narrower by the diffusion length, for which the implanted impurity atoms diffuse through the semiconductor by the heat treatment. At the time of formation of the ion implantation mask 40, the LOCOS oxide film 19 is removed but the LOCOS oxide film 9 is not.

The net impurity amount in the n-type well 32 after various kinds of heat treatments for forming the device have been conducted is not always proportional to the opening ratio due to the impurity concentration in the p-type semiconductor substrate 1. However, since the n-type well 32 is continuous in the portion corresponding to the non-opening stripe 42 of the ion implantation mask 40, due to the impurity diffusion by the heat treatment, the average impurity amount in the n-type well 32 is higher in the channel section A than in the drift and drain sections B and C. Therefore, one single n-type well 32 is formed deeply in the channel section A and shallowly in the drift and drain sections B and C as shown in FIG. 7(a). In other words, since it is not necessary to conduct ion implantation twice as in the second embodiment, the effects same as those of the MOSFET of the first or second embodiment are obtained without further increasing any manufacturing step.

By opening a part of the portion of ion implantation mask 40 corresponding to the channel section A such that the opening ratio thereof is higher than the opening ratio in the drift and drain sections B and C in place of fully opening the portion of the ion implantation mask 40 corresponding to the channel section A, the same effects can be obtained. In thermally driving the impurity atoms, it is not always necessary for the n-type well 32 to become continuous in the portion corresponding to the non-opening stripes 42 of the ion implantation mask 40. If the average net impurity concentration in the n-type well 32 in the drift section B is between $0.5 \times 10^{12}$ cm$^{-2}$ and $3.0 \times 10^{12}$ cm$^{-2}$, which is the RESURF condition, the tradeoff relation between the ON-resistance and the breakdown voltage can be improved due to the RESURF effects obtained by appropriately setting the impurity concentration in the p-type semiconductor substrate 1.

Referring to FIGS. 8(a) and (b), the lateral MOSFET according to the fourth embodiment has the cross-sectional structure the third embodiment shown in FIG. 8(a). In the fourth embodiment, the opening shape in the portion of the ion implantation mask 50 corresponding to the drift and drain sections B and C is different from that of the third embodiment. The openings 51 in the portion of the ion implantation mask 50 corresponding to the drift and drain sections B and C in the MOSFET are shaped as square islands as shown in FIG. 8(b). The openings in the ion implantation mask 50 are narrower by the diffusion length, for which the implanted impurity atoms diffuse through the semiconductor by the heat treatment.

If the opening ratio in the portion of the ion implantation mask 50 corresponding to the drift and drain sections B and C is the same as the opening ratio of the third embodiment, the n-type well 32 will exhibit substantially the same effects as the third embodiment. If the n-type islands are not connected to each other by thermally driving the impurity atoms, and one single continuous n-type well 32 is thus not formed, the designed MOSFET operations will not likely be obtained since the drift section B is continuous. For avoid this trouble, it is necessary for the ion implantation mask 50 to have a pattern that facilitates making the impurity diffusion length from the opening 51 longer than at least the width of the non opening network 52.

Figures 9A, 9B:
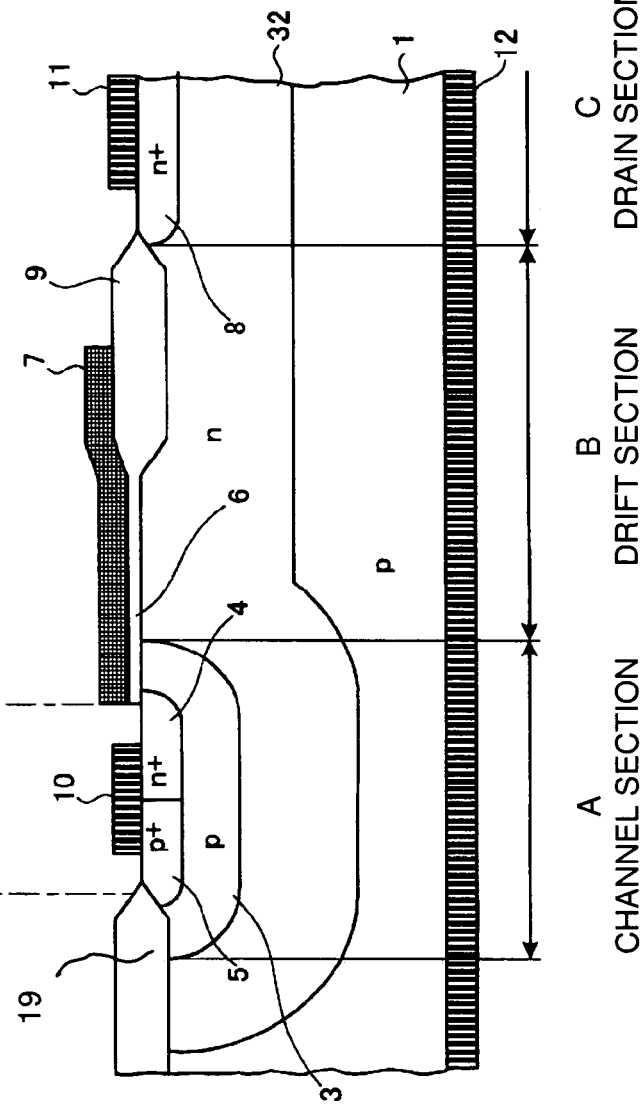
FIGS. 9(a)-(b) illustrate a cross-sectional view of a fifth embodiment of a lateral MOSFET embodying the present invention, where

Referring to FIGS. 9(a) and (b), the lateral MOSFET according to the fifth embodiment is similar to the fourth embodiment, except that the fifth embodiment has an ion implantation mask 60 having openings 61 and a non-opening network 62 patterned with the squares being parallel diagonally as shown in FIG. 9(b). The shapes of the openings 51 and 61 are not limited to a square shape, but can include other shapes, such as circular, triangular, etc. Various changes and modifications are possible for the shapes of the openings and the non-opening portion and for the arrangement pattern thereof.

Referring to FIGS. 10(a) and (b), the lateral MOSFET according to the sixth embodiment uses an ion implantation mask 80 having a different pattern for forming an n-type well 72. In the fifth embodiment, the n-type well 72 is formed more deeply in the channel and drain sections A and C than in the drift section B. In the n-type well 72, the substantial impurity amount in the drift section B is smaller than the substantial impurity amount in the vicinity of the channel section A or in the vicinity of the drain section C. Since the other MOSFET configurations are the same as those of the third embodiment, their duplicated descriptions are omitted.

Now the ion implantation mask for forming the n-type well 72 having the impurity distribution and depth profiles described above follows. As shown in FIG. 10(b), the ion implantation mask 80 is fully open in the portions thereof corresponding to the channel section A and the drain section C. The opening ratio of the portion of the ion implantation mask 80 corresponding to the drift section B is less than 1. In the illustrated example, the portion of the ion implantation mask 80 corresponding to the drift section B is formed of opening stripes 81 and non-opening stripes 82 extending parallel to each other. Alternatively, the portion of the ion implantation mask 80 corresponding to the drift section B can have a planar pattern that includes island-shaped openings similar to the ion implantation mask of the fourth or fifth embodiment. The openings in the ion implantation mask 80 can be made narrower by the diffusion length, for which the implanted impurity atoms diffuse through the semiconductor by the heat treatment.

Since the gradient is formed in the impurity amount in the portion of the n-type well 72 in the drift section B in the vicinity of the drain section C, the lowering of the breakdown voltage in the ON-state of the device (the ON-state breakdown voltage lowering) is relaxed. The ON-state breakdown voltage lowering occurs when the space charge distribution in the strong-electric-field region of the drift section B, which appears when a high voltage is applied, is modified by the majority carriers (electrons in this case) flowing into the strong-electric-field region and the electric field strength in the drain-side end portion of the drift section B is raised. When the electric field strength in the drain-side end portion of the drift section B is raised, the minority carriers (holes in this case) caused by the impact ionization of the carriers lower the electric field strength in the central part of the strong-electric-field region, lowering the voltage by current increase (negative resistance). As a result, the breakdown voltage in the ON-state of the device is lowered.

Providing an impurity concentration gradient in the drain-side end portion of the drift section B prevents lowering of the ON-state breakdown voltage by the suppressing effect of the negative resistance due to the strong-electric-field region elongated by the current increase. By appropriately setting the impurity concentration gradient, it is possible to set the ON-state breakdown voltage to be higher than the static breakdown voltage. In place of fully opening the portions of the ion implantation mask 80 corresponding to the channel and drain sections A and C, the opening ratio in the portion corresponding to the channel section A and the opening ratio in the portion corresponding to the drain section C can be set different from each other considering the necessary punch-through breakdown voltage and the ON-state breakdown voltage. The portion of the ion implantation mask 80 corresponding to the channel section A or the portion of the ion implantation mask 80 corresponding to the drain section C can have a different opening ratio.

Referring to FIG. 11(a)-(b), the lateral MOSFET according to the seventh embodiment is similar to the sixth embodiment, except for the planar pattern of an ion implantation mask for forming an n-type well. In the seventh embodiment, the portion of an ion implantation mask 100 corresponding to the drift section B has wider openings 101 on the side close to drain section C than on the side close to the channel section A as shown FIG. 11(b). In other words, in the portion of the ion implantation mask 100 corresponding to the drift section B, the non-openings 102 are narrower on the side close to the drain section C than on the side close to the channel section A. The mask 100 having the pattern described above also can be used with the other embodiments. In short, the opening ratio in the portion of the ion implantation mask 100 corresponding to the drift section B becomes wider toward the portion thereof corresponding to the drain section C. Since the n-type well 92 as shown in FIG. 11(a) is formed by using the ion implantation mask 100, the tradeoff relation between the ON-resistance and the ON-state breakdown voltage can be further improved.

As described above in the first to seventh embodiments, since the impurity concentration in the n-type well 2, 22, 32, 72, or 92 between the p-type 3 and the LOCOS oxide film 9 is optimized, a lateral MOSFET that exhibits a high breakdown voltage and low on-resistance can be obtained. Since the impurity amount and the thickness of the n-type well beneath the p-well 3 can be increased, the punch-through breakdown voltage between the p-type semiconductor substrate 1 and the p-type well 3 necessary for a high-side switch can be raised.

The semiconductor device and the method of manufacturing the semiconductor device according to the invention are useful for obtaining a semiconductor switching device and especially suitable for obtaining a lateral MOSFET best suited for a high-side switch. By increasing the impurity concentration in the portion of the n-type well in the vicinity of the junction between the p-type well and the n-type well beneath the gate, the lateral MOSFET can be suited for a high-side switch.

The present MOSFET can have a high impurity concentration in the semiconductor region of the second conductivity type in the vicinity of the junction between the channel region and the first semiconductor region beneath the gate, namely by increasing the impurity concentration in the second semiconductor region. Accordingly, the tradeoff relation between the breakdown voltage and the ON-voltage can be improved. Further, since the impurity amount and the thickness of the semiconductor region of the second conductivity type beneath the channel region can be increased, namely by forming the second semiconductor region deeply, a high punch-through breakdown voltage preferable for a high-side switch can be obtained. The electric field in the portion of the first semiconductor region below the thick insulator film can be relaxed. The tradeoff relation between the ON-resistance and the breakdown voltage is improved by the RESURF effects of the first semiconductor region.

A MOSFET structure that improves the tradeoff relation between the breakdown voltage and the ON-voltage and obtains a high punch-through breakdown voltage can be obtained without increasing the manufacturing steps.

The ion implantation regions in which the first semiconductor region and the second semiconductor region are formed can be determined by the same kind of insulator masks formed at the same time. Accordingly, the first semiconductor region and the second semiconductor region can be formed precisely without being affected by the mask positioning precision. As the first semiconductor region and the second semiconductor region can be formed with the same mask film simultaneously, the first semiconductor region and the second semiconductor region can be formed precisely through one step without being affected by the mask positioning precision.

The impurity concentration and the depth for the first semiconductor region and the impurity concentration and the depth for the second semiconductor region can be set independently of each other. The impurity concentration in the first semiconductor region can be set lower than that the impurity concentration in the second semiconductor region or the first semiconductor region can be formed more shallowly than the second semiconductor region.

Although the present invention has been described in connection with the illustrated embodiments, given the disclosure of the present invention, one versed in the art would appreciate that there may be other embodiments and modifications within the scope and spirit of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Application No. 2004-228598, filed on 4 Aug. 2004, and the disclosure of the priority application, in its entirety, including the drawings, claims, and the specification thereof, is incorporated herein by reference.

What is claimed is:

1. A semiconductor device comprising:
   a semiconductor layer of a first conductivity type;
   a first semiconductor region of a second conductivity type in the surface portion of the semiconductor layer;
   a drain region of the second conductivity type in the first semiconductor region;
   a second semiconductor region of the second conductivity type in contact with or overlapping with the first semiconductor region;
   a channel region of the first conductivity type in the surface portion of the second semiconductor region;
   a source region of the second conductivity type in the channel region; and
   a gate electrode above the channel region between the source region and the first semiconductor region with a gate insulator film interposed therebetween,
   wherein the net total impurity amount in the first semiconductor region is smaller than the net total impurity amount in the second semiconductor region, and
   wherein, under the gate electrode between the drain region and the channel region, an impurity concentration in a channel region side of the second semiconductor region is higher than the impurity concentration of the first semiconductor region.

2. The semiconductor device according to claim 1, wherein the channel region is spaced apart from the drain region.

3. The semiconductor device according to claim 1, wherein the second semiconductor region is doped more heavily than the first semiconductor region.

4. The semiconductor device according to claim 1, wherein the first semiconductor region is contiguous or continuous with the second semiconductor region.

5. The semiconductor device according to claim 1, wherein the net total impurity amount in the first semiconductor region is larger on the side of the drain region than on the side of the second semiconductor region.

6. The semiconductor device according to claim 1, further including a thick insulator layer for relaxing an electric field on a portion of the first semiconductor region between the drain region and the channel region, the portion of the first semiconductor region being spaced apart from the channel region.

7. The semiconductor device according to claim 1, wherein the net total impurity amount per unit area in the first semiconductor region is between $0.5 \times 10^{12}$ cm$^{-2}$ and $3.0 \times 10^{12}$ cm$^{-2}$.

8. A method of manufacturing the semiconductor device comprising:
   a semiconductor layer of a first conductivity type;
   a first semiconductor region of a second conductivity type in the surface portion of the semiconductor layer;
   a drain region of the second conductivity type in the first semiconductor region;
   a second semiconductor region of the second conductivity type in contact with or overlapping with the first semiconductor region;
   a channel region of the first conductivity type in the surface portion of the second semiconductor region;
   a source region of the second conductivity type in the surface portion of the channel region;
   a contact region of the first conductivity type in the surface portion of the channel region and contiguous with the source region;
   a source electrode in contact with both the source region and the contact region; and
   a gate electrode above the channel region between the source region and the first semiconductor region with a gate insulator film interposed therebetween,
   wherein the net total impurity amount in the first semiconductor region is smaller than the net total impurity amount in the second semiconductor region, and
   wherein, under the gate electrode between the drain region and the channel region, an impurity concentration in a channel region side of the second semiconductor region is higher than the impurity concentration of the first semiconductor region,
   the method comprising the steps of:
   forming thick insulator films selectively on the surface of the semiconductor layer; implanting impurity ions of the second conductivity type in an self-aligning manner into portions of the semiconductor layer, to form the first semiconductor region and the second semiconductor region, using the thick insulator films as ion implantation masks;
   covering the portion of the semiconductor layer where the first semiconductor region is to be formed, with a mask film; and
   implanting impurity ions of the second conductivity type in an self-aligning manner into the portion of the semiconductor layer where the second semiconductor region is to be formed, using the thick insulator films and the mask film as ion implantation masks.

9. A method of manufacturing a semiconductor device comprising:
   a semiconductor layer of a first conductivity type;
   a first semiconductor region of a second conductivity type in the surface portion of the semiconductor layer;
   a drain region of the second conductivity type in the first semiconductor region;
   a second semiconductor region of the second conductivity type in contact with or overlapping with the first semiconductor region;
   a channel region of the first conductivity type in the surface portion of the second semiconductor region;
   a source region of the second conductivity type in the surface portion of the channel region;
   a contact region of the first conductivity type in the surface portion of the channel region and contiguous with the source region;
   a source electrode in contact with both the source region and the contact region; and
   a gate electrode above the channel region between the source region and the first semiconductor region with a gate insulator film interposed therebetween,
   wherein the net total impurity amount in the first semiconductor region is smaller than the net total impurity amount in the second semiconductor region, and
   wherein, under the gate electrode between the drain region and the channel region, an impurity concentration in a channel region side of the second semiconductor region is higher than the impurity concentration of the first semiconductor region,
   the method comprising the steps of:
   forming a thick insulator film selectively on the surface of the semiconductor layer;
   covering portions of the semiconductor layer where the first semiconductor region and the second semiconductor region are to be formed, with a mask film having openings; and
   implanting impurity ions of the second conductivity type in an self-aligning manner into the portions of the semiconductor layer where the first semiconductor region and the second semiconductor region are to be formed, using the thick insulator film and the mask film as ion implantation masks.

10. The method according to claim 9, wherein an opening shape in the portion of the mask film for forming the first semiconductor region is different from an opening shape in the portion of the mask film for forming the second semiconductor region.

11. The method according to claim 10, wherein the portion of the mask film for forming the first semiconductor region has a plurality of openings.

* * * * *